(12) United States Patent
Fukuda

(10) Patent No.: US 7,601,605 B2
(45) Date of Patent: Oct. 13, 2009

(54) METHOD FOR MANUFACTURING SEMICONDUCTOR DEVICE, METHOD FOR FORMING ALIGNMENT MARK, AND SEMICONDUCTOR DEVICE

(75) Inventor: Hiroshi Fukuda, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/689,108

(22) Filed: Mar. 21, 2007

(65) Prior Publication Data

US 2007/0224797 A1    Sep. 27, 2007

(30) Foreign Application Priority Data

Mar. 22, 2006    (JP)    ............... 2006-078255

(51) Int. Cl.
*H01L 21/76*    (2006.01)

(52) U.S. Cl. ............... 438/401; 257/797; 257/E23.179; 438/462

(58) Field of Classification Search ............... 438/401, 438/462; 257/797, E23.179
See application file for complete search history.

(56) References Cited

U.S. PATENT DOCUMENTS

| | | | |
|---|---|---|---|
| 6,514,851 B2 | 2/2003 | Saito | |
| 6,617,669 B2 | 9/2003 | Saito | |
| 6,635,567 B2 * | 10/2003 | Ebertseder et al. | 438/638 |
| 6,903,002 B1 * | 6/2005 | Ben-Tzur et al. | 438/622 |
| 2003/0017707 A1 * | 1/2003 | Yamashita et al. | 438/694 |
| 2003/0119273 A1 * | 6/2003 | Aggarwal et al. | 438/396 |
| 2004/0027786 A1 * | 2/2004 | Fujii et al. | 361/312 |
| 2005/0265072 A1 * | 12/2005 | Hart et al. | 365/163 |

FOREIGN PATENT DOCUMENTS

| | | |
|---|---|---|
| JP | 2001-358048 | 12/2001 |
| JP | 2002-373974 | 12/2002 |
| JP | 2004-039731 | 2/2004 |
| JP | 2005-142252 | 6/2005 |

* cited by examiner

*Primary Examiner*—Asok K Sarkar
(74) *Attorney, Agent, or Firm*—Harness, Dickey & Pierce, P.L.C.

(57) ABSTRACT

A method for manufacturing a semiconductor device includes the steps of: forming a first dielectric film on a substrate; etching the first dielectric film in a plug forming region to form a first via hole; forming a first plug electrode in the first via hole; forming a conductive film on the first dielectric film where the first plug electrode is formed; selectively etching the conductive film to form a local wiring on the first plug electrode and to form a pad layer on the first dielectric film in a specified region; forming a second dielectric film on the first dielectric film, thereby covering the local wiring and the pad layer; selectively etching the second dielectric film, thereby forming a second via hole in the second dielectric film with the local wiring as a bottom surface, and an opening section in the second dielectric film with the pad layer as a bottom surface; forming a metal film on the second dielectric film, thereby embedding the second via hole and the opening section; and applying a CMP processing to the metal film to remove the metal film on the second dielectric film, thereby forming a second plug electrode in the second via hole and forming an alignment mark on the pad layer.

9 Claims, 2 Drawing Sheets

METHOD FOR MANUFACTURING SEMICONDUCTOR DEVICE, METHOD FOR FORMING ALIGNMENT MARK, AND SEMICONDUCTOR DEVICE

The entire disclosure of Japanese Patent Application No. 2006-078255, filed Mar. 22, 2006 is expressly incorporated by reference herein.

BACKGROUND

1. Technical Field

The present invention relates to a method for manufacturing a semiconductor device, a method for forming an alignment mark, and a semiconductor device, and particularly relates to a technology by which, even when an alignment mark is large in size, its abnormal oxidation can be prevented.

2. Related Art

Alignment of a wafer and a photomask is an essential step in a process for manufacturing a semiconductor device, and it is required to suppress an error that may be generated in the alignment step to the minimum. In order to correctly superpose a pattern to be successively formed on a pattern provided on a wafer, alignment marks are used (for example, Japanese laid-open patent applications, JP-A-2002-373974, JP-A-2005-142252, JP-A-2004-39731 describe examples of related art). There are many alignment marks in a variety of shapes and sizes, and most of them are in a rectangular form as viewed in a plan view, and has sides that are several μm to several ten μm in length, as exemplified by the following marks A-D:

Mark A: 3 μm in length×4 μm in width
Mark B: 4 μm in length×4 μm in width
Mark C: 6 μm in length×72 μm in width
Mark D: 15-25 μm in length×15-25 μm in width When a plug electrode is formed on a semiconductor substrate, a via hole (also called a "contact hole") is formed in an interlayer dielectric film, and an opening section for an alignment mark is formed at a position separated from the via hole. Then a tungsten (W) film is formed on the interlayer dielectric film, thereby embedding the via hole with the W film. The W film is formed by a CVD (chemical vapor deposition) method. Then, CMP (chemical mechanical polishing) is applied to the entire upper surface of the semiconductor substrate to remove the W film on the interlayer dielectric film, whereby the plug electrode and the alignment mark are completed.

The alignment mark has a unit pattern size of several μm square or greater, which is larger than a pattern (<1 μm) that is used in an actual circuit, such that a step difference is formed in the surface of the W film that composes the alignment mark. In other words, in a CVD method, the smaller the diameter of a hole, the quicker the hole tends to be embedded, such that embedding of the via hole is completed before the opening section is completely embedded by the W film. When the opening section is actually used as an alignment mark, the incompletely embedded opening section would not particularly cause a problem because the opening section cannot be recognized as a mark without a step difference being present to some degree.

However, in a process for manufacturing a ferroelectric memory (FeRAM: ferroelectric RAM), after a plug electrode and an alignment mark are formed, an oxidation barrier film is formed over them, and a high-temperature heat treatment is conducted. At this time, as shown in FIG. 3, if a step difference at an alignment mark is too deep (large), the coverage of an oxidation barrier film 91 in an opening section H' is reduced (in other words, the oxidation barrier film 91 would have locally thin portions, such as, portions circled by dotted lines in FIG. 3). As a result, the required barrier property of the oxidation barrier film 91 is lost, which causes a problem in that a W film 93 inside the opening section H' becomes abnormally oxidized.

When the W film 93 is abnormally oxidized, its volume expands (in other words, the alignment mark expands), which leads to a possibility that the accuracy in aligning the wafer and photomask in steps after the high-temperature treatment may lower. Also, the expanded oxide may be scattered over the wafer surface, and may remain as particles.

SUMMARY

In accordance with an advantage of some aspects of the invention, there are provided a method for manufacturing a semiconductor device, a method for forming an alignment mark, and a semiconductor device, in which, even when an alignment mark is large in size, its abnormal oxidation can be prevented.

A method for manufacturing a semiconductor device in accordance with an embodiment of the invention includes the steps of: forming a first dielectric film on a substrate; etching the first dielectric film in a plug forming region to form a first via hole; forming a first plug electrode in the first via hole; forming a conductive film on the first dielectric film where the first plug electrode is formed; selectively etching the conductive film to form a local wiring on the first plug electrode and to form a pad layer on the first dielectric film in a specified region; forming a second dielectric film on the first dielectric film to thereby cover the local wiring and the pad layer; selectively etching the second dielectric film to form a second via hole in the second dielectric film with the local wiring as a bottom surface, and to form an opening section in the second dielectric film with the pad layer as a bottom surface; forming a metal film on the second dielectric film thereby embedding the second via hole and the opening section; and applying a CMP processing to the metal film to thereby remove the metal film on the second dielectric film, whereby a second plug electrode is formed in the second via hole, and an alignment mark is completed on the pad layer.

The method for manufacturing a semiconductor device in accordance with an aspect of the embodiment of the invention further includes the steps of forming an oxidation barrier film on the second dielectric film after the alignment mark is completed, and applying a high-temperature heat treatment to the entire substrate after the oxidation barrier film is formed.

It is noted that the "high-temperature heat treatment" is, for example, a heat treatment that is conducted in an oxygen atmosphere when forming a ferroelectric film such as SBT ($SrBi_2Ta_2O_9$), PZT ($PbZr_xTi_{1-x}$) or the like. In the process of manufacturing a semiconductor device having a ferroelectric film (for example FeRAM), a heat treatment at high temperature needs to be conducted in an oxygen atmosphere for crystallizing the material of the ferroelectric film, recovering the ferroelectric film from process damages inflicted by sputtering and etching, or the like. The temperature of the heat treatment is, for example, about 600° C. to about 800° C.

According to the methods for manufacturing a semiconductor device described above, when the second via hole and the opening section are formed in the second dielectric film by selective etching, the local wiring and the pad layer can be used as etching stopper, such that the etching can be prevented from advancing to the first dielectric film, and therefore the opening section can be formed shallow.

Accordingly, the opening section can be readily embedded with the metal film, and the step difference in the surface of the metal film (i.e., the alignment mark) within the opening section after the CMP processing can be made smaller. By this, the oxidation barrier film can be formed on the alignment mark with a higher level of coverage, and abnormal oxidation of the alignment mark can be prevented in a high-temperature heat treatment to be conducted after the oxidation barrier film is formed.

A method for forming an alignment mark in accordance with an embodiment of the invention includes the steps of: forming a first dielectric film on a substrate; forming a pad layer on the first dielectric film in a specified region; forming a second dielectric film on the first dielectric film to cover the pad layer; selectively etching the second dielectric film to form a opening section in the second dielectric film with the pad layer as a bottom surface; forming a metal film on the second dielectric film to embed the opening section; and applying a CMP processing to the metal film thereby removing the metal film on the second dielectric film, whereby an alignment mark is completed on the pad layer.

According to this method, the pad layer can be used as an etching stopper when forming the opening section, such that the opening section can be formed shallow. Accordingly, the opening section can be readily embedded with the metal film, and the step difference in the surface of the metal film (i.e., the alignment mark) within the opening section after the CMP processing can be made smaller. By this, the oxidation barrier film can be formed on the alignment mark with a higher level of coverage, and abnormal oxidation of the alignment mark can be prevented in a high-temperature heat treatment to be conducted after the oxidation barrier film is formed.

A semiconductor device in accordance with another embodiment of the invention includes: a substrate; a first dielectric film formed on the substrate; a second dielectric film formed on the first dielectric film; an alignment mark composed of a metal film embedded in an opening section formed in the second dielectric film; and a pad layer provided between the alignment mark and the first dielectric film wherein the pad layer functions as an etching stopper when forming the opening section in the second dielectric film.

With the structure described above, etching can be prevented from advancing to the first dielectric film when the opening section is formed, and therefore the opening section can be formed shallow. Accordingly, the opening section can be readily embedded with the metal film, and the step difference in the surface of the metal film (i.e., the alignment mark) within the opening section can be made smaller. The invention is particularly favorable when applied to FeRAMs and the like.

DESCRIPTION OF EXEMPLARY
EMBODIMENTS

Preferred embodiments of the invention are described with reference to the accompanying drawings. FIGS. 1A-2C are views showing the steps of a method for manufacturing a semiconductor device in accordance with an embodiment of the invention. In the present embodiment, a plug electrode extending from a semiconductor substrate to an upper surface of an interlayer dielectric film is divided into a first plug electrode and a second plug electrode, the first plug electrode and the second plug electrode are connected to each other by a local interconnect (hereafter referred to as a "LI layer"), and the LI layer is also provided below an alignment mark.

Figure 1A:
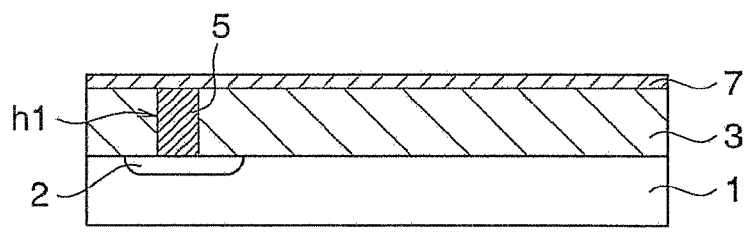
FIGS. 1A-1D are cross-sectional views showing the steps of a method for manufacturing a semiconductor device in accordance with an embodiment of the invention.

As shown in FIG. 1A, first, a first interlayer dielectric film is formed on a silicon substrate (wafer) 1. The semiconductor substrate 1 is, for example, a silicon (Si) substrate, and devices, such as, for example, MOS transistors (not shown) are formed thereon. Also, the first interlayer dielectric film 3 is, for example, a silicon oxide film having a thickness of, for example, about 1000 nm.

Next, the first interlayer dielectric film 3 is selectively etched by using photolithography technique and etching technique, whereby a first via hole h1 is formed on an impurity diffusion layer 2 formed in the semiconductor substrate 1. The impurity diffusion layer 2 may be, for example, a source or a drain of a MOS transistor (not shown).

Next, a tungsten (W) film is formed on the first interlayer dielectric film 3 in which the first via hole h1 is formed, thereby embedding the first via hole h1 by the tungsten film. The W film may be formed by, for example, a CVD method. Then, a CMP processing is applied to the W film, thereby removing the W film on the first interlayer dielectric film 3. By this, as shown in FIG. 1A, a first plug electrode 5 is formed in the first via hole h1.

Then, as shown in FIG. 1A, a conductive film 7 is formed on the first interlayer dielectric film 3 in which the first plug electrode 5 is formed. It is noted that the conductive film 7 may be composed of a lower layer of titanium nitride (TiN) and an upper layer of titanium (Ti) (in other words, a film of laminated layers of Ti/TiN). The Ti film has a film thickness of, for example, 20 nm, and the TiN film has a film thickness of, for example, 180 nm. The conductive film 7 may be formed by, for example, a sputter method.

Figure 1B:
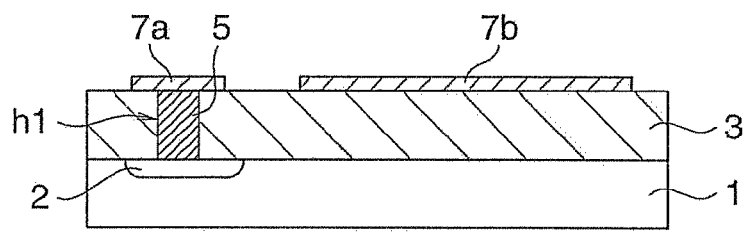

Next, the conductive film 7 is selectively etched by using photolithography technique and etching technique, thereby forming a LI layer 7*a* composed of, for example, Ti/TiN on the first plug electrode 5, and a LI layer 7*b* composed of, for example, Ti/TiN on the first interlayer dielectric film 3 in an alignment mark forming region, as shown in FIG. 1B. The LI layer 7*a* and the LI layer 7*b* may be connected to each other in an area unshown, or may not be connected to each other (in other words, may not be electrically connected to each other).

Figure 1C:
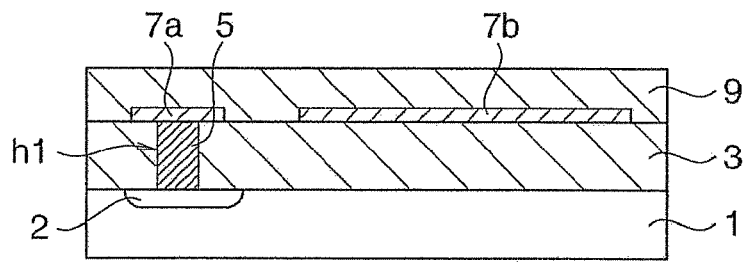

Then, as shown in FIG. 1C, a second interlayer dielectric film 9 is formed on the first interlayer dielectric film 3, thereby covering the LI layer 7*a* and the LI layer 7*b*. The second interlayer dielectric film 9 may be, for example, a silicon oxide film, and has a thickness of, for example, about 800 nm.

Figure 1D:
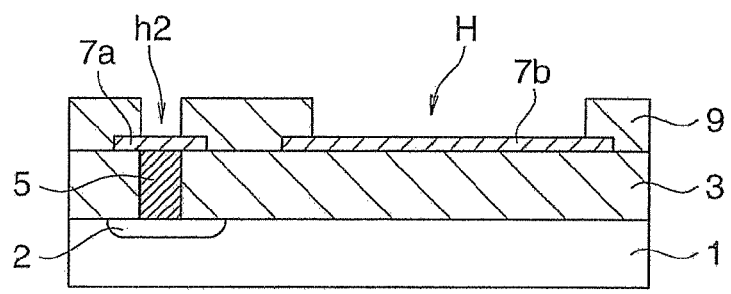

Next, as shown in FIG. 1D, the second interlayer dielectric film 9 is selectively etched by using photolithography technique and etching technique, thereby forming a second via hole h2 in the second interlayer dielectric film 9 with the LI layer 7*a* being a bottom surface, and forming an opening section H in the second interlayer dielectric film 9 with the LI layer 7*b* being a bottom surface. Although not shown, the first and second via holes h1 and h2 have, for example, a circular shape as viewed in a plan view, and its diameter is, for example, about 0.1-1 μm. Also, the shape of the opening section H in a plan view may be rectangular, and the length of its side may be, for example, 2-30 μm.

Figure 2A:
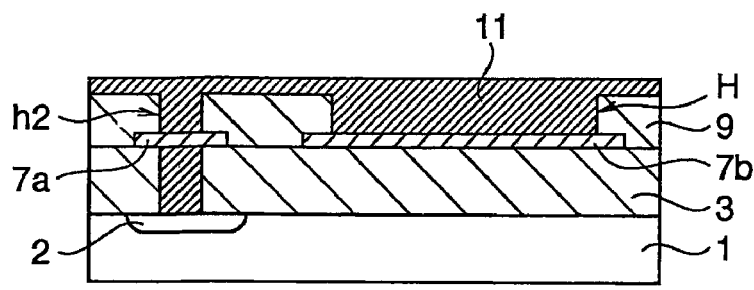
FIGS. 2A-2C are cross-sectional views showing the steps of the method for manufacturing a semiconductor device in accordance with the embodiment of the invention.
Figure 2B:
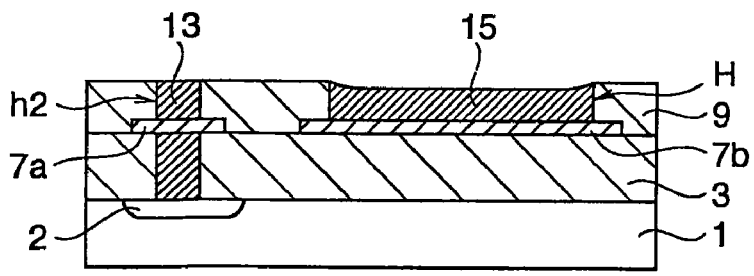

Next, as shown in FIG. 2A, a W film 11 is formed on the second interlayer dielectric film 9 where the second via hole h2 and the opening section H are formed, thereby embedding the second via hole h2 and the opening section H with the W film. The W film 11 may be formed by for example, a CVD method. Then, a CMP processing is applied to the W film 11, thereby removing the W film 11 on the second interlayer dielectric film 9. By this, as shown in FIG. 2B, a second plug electrode 13 is formed in the second via hole h2, and an alignment mark 15 is completed on the LI layer 7b. It is noted that the surface of the alignment mark 15 is formed in a slightly concave shape due to dishing resulted from the CMP processing.

Figure 2C:
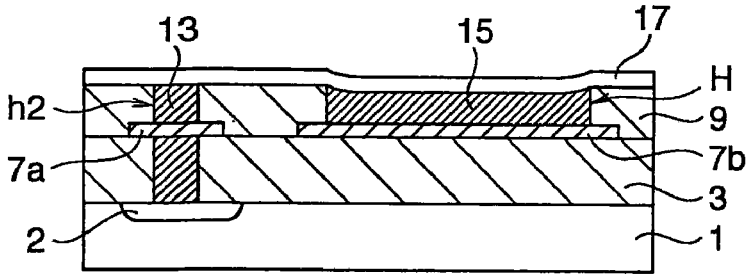
Figure 3:
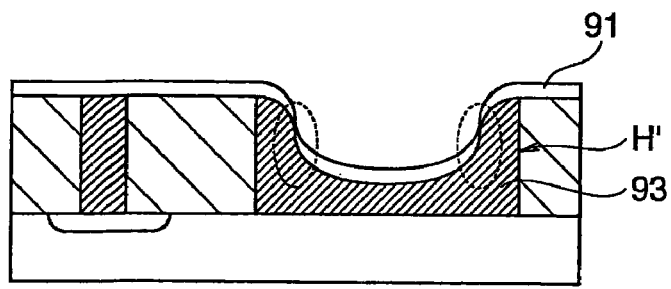
FIG. 3 is a view showing the problem of an example in the related art.

Then, as shown in FIG. 2C, an oxidation barrier film 17 is formed on the second interlayer dielectric film 9. The surface of the W film (i.e., the alignment mark 15) within the opening section H is formed with a smaller step difference compared to a conventional example, such that the oxidation barrier film 17 can be formed with a higher level of coverage. The oxidation barrier film 17 is a laminated film of layers of, for example, TiAlN (lower layer)/Ir (middle layer)/IrOx (upper layer). The thickness of the TiAlN layer is, for example, 100 nm, the thickness of the Ir layer is, for example, 50 nm, and the thickness of the IrOx layer is, for example, 100 nm.

Then, a ferroelectric film such as SBT, PZT or the like (not shown) is formed on the second interlayer dielectric film 9. Then, a high-temperature heat treatment is applied to the entire semiconductor substrate 1 on which the ferroelectric film is formed in an oxygen atmosphere. The temperature of the heat treatment is, for example, about 600° C. to 800° C. At this time, the top surface of the alignment mark 15 composed of the W film is covered by the oxidation barrier film 17 with a high level of coverage such that its abnormal oxidation can be prevented.

In this manner, according to the embodiment described above, when the second via hole h2 and the opening section H are formed in the second interlayer dielectric film 9 by selective etching, the LI layers 7a and 7b can be used as etching stopper, such that the etching can be prevented from advancing to the first interlayer dielectric film 3, and therefore the opening section H can be formed shallow.

Accordingly, the opening section H can be readily embedded with the W film, and the step difference in the surface of the alignment mark 15 can be made smaller. By this, the oxidation barrier film 17 can be formed on the alignment mark 15 with a high level of coverage, which can consequentially prevent abnormal oxidation of the alignment mark 15 in the high-temperature treatment conducted after the oxidation barrier film 17 is formed. Accordingly, negative effects (for example, a lowered alignment accuracy due to expansion of the alignment mark, generation of particles originated from the alignment mark, and the like) in the steps to be conducted after the high-temperature heat treatment can be prevented.

In the present embodiment, the semiconductor substrate 1 may correspond to a "substrate" in the invention, the first interlayer dielectric film 3 may correspond to a "first dielectric film" in the invention, and the second interlayer dielectric film 9 may correspond to a "second interlayer dielectric film" in the invention. Also, the LI layer 7a may correspond to a "local wiring" in the invention, and the LI layer 7b may correspond to a "pad layer" in the invention. Furthermore, the W film 11 may correspond to a "metal film" in the invention. It is noted that, in the present embodiment described above, the first interlayer dielectric film 3 is formed to a thickness of, for example, 1000 nm, and the second interlayer dielectric film 9 is formed to a thickness of, for example, 800 nm. However, these numerical values are only examples. In order to make the step difference in the surface of the alignment mark 15 smaller, it is preferred that, the larger the alignment mark 15 in size, the thicker the first interlayer dielectric film 3 and the thinner the second interlayer dielectric film 9 are to be made.

Also, in accordance with the present embodiment described above, a laminated film of layers of TiAlN/Ir/IrOx is used as the oxidation barrier film 17. However, the materials are not limited to the above. As the oxidation barrier film 17, for example, TiN, TiAlN, $Al_2O_3$, a laminated film of Ti and TiN layers, or the like can also be used.

It is noted that the alignment marks 15 in accordance with the present embodiment may also be used as alignment marks for an exposure apparatus, BOX marks/Vernier marks (alignment test marks), L marks (insertion accuracy measuring marks used by the mask makers), and characters and codes to be inserted in layers, and the like.

What is claimed is:

1. A method for manufacturing a semiconductor device, the method comprising:
    forming a first dielectric film on a substrate;
    forming a first conductive film on the first dielectric film;
    forming a second dielectric film on the first conductive film;
    etching the second dielectric film to form a first contact hole and an opening section;
    forming a second conductive film on the second dielectric film such that the first contact hole and the opening section are filled with the second conductive film; and
    removing a portion of the second conductive film to expose a surface of the second dielectric film where the first contact hole and the alignment mark are not formed, the opening section filled with the second conductive film forming an alignment mark; and
    forming an oxidation barrier film on the second conductive film to protect the second conductive film from oxidation,
    wherein the step of removing the portion of the second conductive film includes a chemical mechanical polishing method that removes another portion of the second conductive film located at edges of the opening section such that a step difference between a surface of the second dielectric layer and the alignment mark is minimized.

2. The method of manufacturing the semiconductor device according to claim 1, the substrate including an impurity diffusion region, the method further comprising:
    etching the first dielectric film to form a second contact hole before the forming of the first conductive film, the second contact hole touching the impurity diffusion region; and
    filling the second contact hole with a third conductive film, the second contact hole and the first contact hole sandwiching a portion of the first conductive film.

3. The method of manufacturing the semiconductor device according to claim 2, the forming of the first conductive film including etching the first conductive film to form a first conductive region and a second conductive region, the first conductive region being positioned between the first contact hole and the second contact hole, the second conductive region being positioned apart form the first conductive region and being positioned between the alignment mark and the first dielectric film.

4. The method of manufacturing the semiconductor device according to claim 1, the first conductive film being configured to be formed of a first layer and a second layer, the first layer including titanium nitride and the second layer including titanium.

5. The method of manufacturing the semiconductor device according to claim 1, the first conductive film and the second conductive film including tungsten.

6. The method of manufacturing the semiconductor device according to claim 1, the oxidation barrier film being configured to be formed of a plurality of layers.

7. The method of manufacturing the semiconductor device according to claim 6, the plurality of layers including a TiAlN layer, an Ir layer and an IrOX layer, the Ir layer being positioned between the TiAn layer and the IrOX layer.

8. The method of manufacturing the semiconductor device according to claim 1, the method further comprising:

forming a ferroelectric film above the second dielectric film; and heating the substrate at a temperature between 600 and 800 degrees Celsius.

9. The method according to claim 1, wherein the second conductive film that forms the alignment mark gradually tapers in a direction toward the substrate at the edges of the opening section relative to an upper surface of the second dielectric film so that the step difference is minimized.

* * * * *